United States Patent [19]

Wilke

[11] 4,423,337
[45] Dec. 27, 1983

[54] GATE CIRCUIT FOR A UNIVERSAL COUNTER

[75] Inventor: William G. Wilke, Beaverton, Oreg.

[73] Assignee: Tektronix, Inc., Beaverton, Oreg.

[21] Appl. No.: 282,368

[22] Filed: Jul. 13, 1981

[51] Int. Cl.³ .......................................... H03K 17/26
[52] U.S. Cl. .................................. 307/247 R; 328/74
[58] Field of Search ...................... 307/247 A, 247 R; 328/72, 74

[56] References Cited

U.S. PATENT DOCUMENTS 3,591,858  7/1971  Boyd .............................. 307/247 R
3,619,790 11/1971  Brooksbank .................... 307/247 R
3,924,193 12/1975  Wolff ............................. 307/247 R
4,031,410  6/1977  Kikuchi .......................... 307/247 A Primary Examiner—John S. Heyman
Attorney, Agent, or Firm—George T. Noe

[57] ABSTRACT

A gating circuit for a universal counter comprises a pair of flip-flops and a pair of logic gates arranged to provide any of a plurality of counting or timing measurements. A gate control circuit includes a control logic unit to provide routing and synchronization of digital signals from several inputs, including an internal source as well as a pair of external sources, into one or both of a pair of count chains.

4 Claims, 5 Drawing Figures

GATE CIRCUIT FOR A UNIVERSAL COUNTER

BACKGROUND OF THE INVENTION

Universal counters are general purpose test instruments used to determine characteristics of applied unknown electrical signals, such as frequency, period, pulse width, pulse rise- and falltimes, time interval between electrical events, and totalization of numbers of electrical events. Basically, most of these characteristics may be determined by conditioning the unknown signals to optimize level transitions, and then counting the transitions or measuring the time between successive transitions. To provide these measurement capabilities, the counter circuits must be gated on for predetermined precise time intervals, and signals must be properly routed and synchronized to effect the desired measurements. In the past, this has involved complex gating and counter structures, and frequently delay matching of signal paths has been required.

SUMMARY OF THE INVENTION

In accordance with the present invention, a gate control circuit for a universal counter provides a routing and synchronization of digital signals from several inputs, including an internal signal source, into one or both of a pair of count chains to thereby facilitate any of a plurality of counting or timing measurements. A first synchronizing flip-flop opens a first gate in response to a first input signal or a second input signal and an arming signal, allowing the first input signal to pass to one of the pair of count chains. A second synchronizing flip-flop opens a second gate in response to an output from the first synchronizing flip-flop and a second input signal, allowing the second input signal to pass to the other of the pair of count chains. The configuration is such that no signal path delay matching is required. The numbers stored in the count chains may be arithmetically manipulated by a processor to provide the various measurement results.

It is therefore one object of the present invention to provide a novel gating circuit for a universal counter.

It is another object of the present invention to provide a simple gating architecture and control circuit therefor for routing and synchronizing digital signals from several inputs in a universal counter apparatus.

It is a further object of the present invention to provide a gating circuit for a counter apparatus in which high-speed signal paths have a minimum of gates, thus providing high bandwidth operation.

It is an additional object of the present invention to provide a gating circuit for a counter apparatus in which delay matching of multiple signal paths is eliminated.

It is yet another object of the present invention to provide a simple gate control circuit for a counter apparatus which may be implemented using two flip-flops and two gate packages, providing savings in components, costs, space, and power consumption.

Other objects and advantages of the present invention will become obvious to those having ordinary skill in the art upon a reading of the following description when taken in conjunction with the accompanying drawings.

DRAWINGS

DETAILED DESCRIPTION OF THE INVENTION

Figure 1:
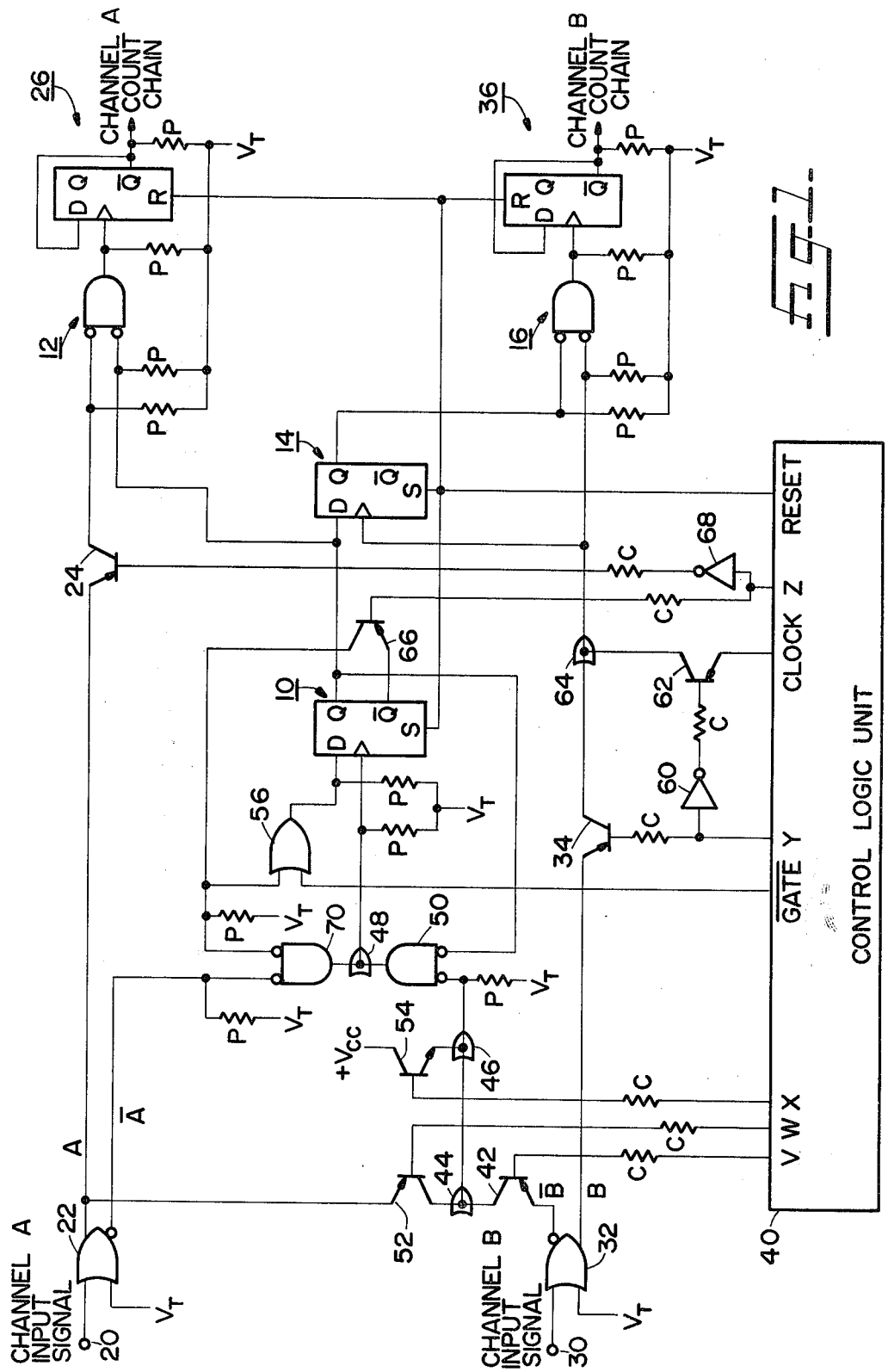
FIG. 1 is a schematic of a gate control circuit for a dual-channel universal counter in accordance with the present invention.

Referring to FIG. 1, there is shown a schematic of a gate control circuit for a dual-channel universal counter apparatus in which a first flip-flop 10, a first gate 12, a second flip-flop 14, and a second gate 16 establish synchronized gating of digital signals to facilitate any of a number of counting and timing measurements. The embodiment shown is implemented in ECL (emitter-coupled logic), and the various components shown are available as off-the-shelf items. A plurality of substantially identical pull-down resistors P are shown throughout the diagram connected between various component leads and some terminal voltage $V_T$, and since such pull-down resistors are conventional, they will not be discussed in detail. In the embodiment built and tested, the resistors P have a value of 75 ohms, and a terminal voltage $V_T$ of +2.7 volts is employed.

A Channel A signal path comprises an input terminal 20, an OR gate 22 operated as a buffer amplifier with complementary outputs A and $\overline{A}$, a transistor switch 24 operated as a common-base amplifier when turned on, the aforementioned gate 12, and the first flip-flop 26 of a counter system, which suitably may be a ripple count chain.

Similarly, a Channel B signal path comprises an input terminal 30, an OR gate 32 having complementary outputs B and $\overline{B}$, a transistor switch 34, the aforementioned gate 16, and the first flip-flop 36 of another count chain.

In both channels A and B of the preferred embodiments, all of the flip-flops 10, 14, 26, and 36 are positive-edge-triggered D-type flip-flops. For reasons which will become apparent later, it is important to realize that the polarity of the signal transition which is used to trigger the synchronizing flipflops 10 and 14 is opposite to the polarity of the signal transition which is used to trigger the count chain flip-flops 26 and 36. The inversion of polarity is brought about by signal inversion through gates 12 and 16. It should be pointed out that flip-flops 26 and 36 could alternatively be negative-edged triggered, with gates 12 and 16 non-inverting, to achieve the same result.

A control logic unit 40 provides a plurality of control logic signals to establish the operating mode of the gate control circuit. The control logic unit 40 suitably may be hard-wired logic gates, the status of which may be established by switches from a control panel, or such control logic unit may be in more sophisticated form, such as a microprocessor or the like. The various logic states and signals produced by the control logic unit and the effects thereof on the gate control circuit are as follows:

Control signal V is applied through a resistor C to the base of a transistor 42 to control the on/off state thereof. Since transistor 42 is shown as a PNP transistor, it will be turned on by a logical low state and turned off by a logical high. When transistor 42 is turned on, it becomes a series element in the high-speed $\overline{B}$ signal path to the clock input of flip-flop 10, which path also includes three hard-wired OR gates 44, 46, and 48, and a negative-input AND gate 50.

Control signal W is applied through another resistor C to the base of a transistor 52 to control the on/off state thereof. It should be pointed out that all of the resistors C in the control signal lines may be equal-valued, and in the embodiment built and tested, these resistors had a value of one kilohm. Transistor 52 when on becomes a series element in the high-speed A signal path via gates 44–48 to the clock input of flip-flop 10.

Control signal X is applied through a resistor C to the base of an NPN transistor 54, which, when turned on by a logical high, disables the negative-input AND gate 50 by pulling one of its inputs to the high state.

Control signal $\overline{GATE}$ is applied via OR gate 56 to the D input of flip-flop 10. When signal $\overline{GATE}$ is low, flip-flop 10 is armed and the low at the D input will be clocked through to the Q output, enabling gate 12 and arming flip-flop 14. This operation will be discussed below in conjunction with a specific example.

Control signal Y is applied via a resistor C to the base of transistor 34 to control the on/off state thereof, and also through an inverter 60 and a resistor C to the base of a transistor 62 to control the on/off state thereof. When signal Y is low, transistor 34 is turned on and transistor 62 is turned off, and the B input signal may pass through transistor 34 and a hard-wired OR gate 64 to the negative-input AND gate 16 and to the clock input of flip-flop 14. When signal Y is high, transistor 34 is turned off and transistor 62 is turned on, allowing CLOCK signals to pass through transistor 62 and OR gate 64 to the AND gate 16 and the flip-flop 14. The CLOCK signal may suitably be any desired stable high-frequency reference, such as, for example, a 320-megahertz clock signal to facilitate accurate time measurements.

Control signal Z is applied via a resistor C to the base of a transistor 66 to control the on/off state thereof, and also through an inverter 68 and a resistor C to the base of transistor 24 to control the on/off state thereof. Transistor 66 when turned on connects the $\overline{Q}$ output from flip-flop 10 to one input of OR gate 56 and one input of a negative-input AND gate 70. Of course, when transistor 66 is off, the collector thereof and the aforementioned inputs of gates 56 and 70 are pulled low by one of the pull-down resistors, to thereby enable both of these gates.

A RESET signal is applied from the control logic unit 40 to initialize the synchronizing flip-flops 10 and 14 by setting both of the $\overline{Q}$ outputs high and both of the Q outputs low upon receipt of a logical high. The count chain flip-flops 26 and 32 are initialized to the reset state (both Q outputs low) by this same signal.

Figures 2, 3:
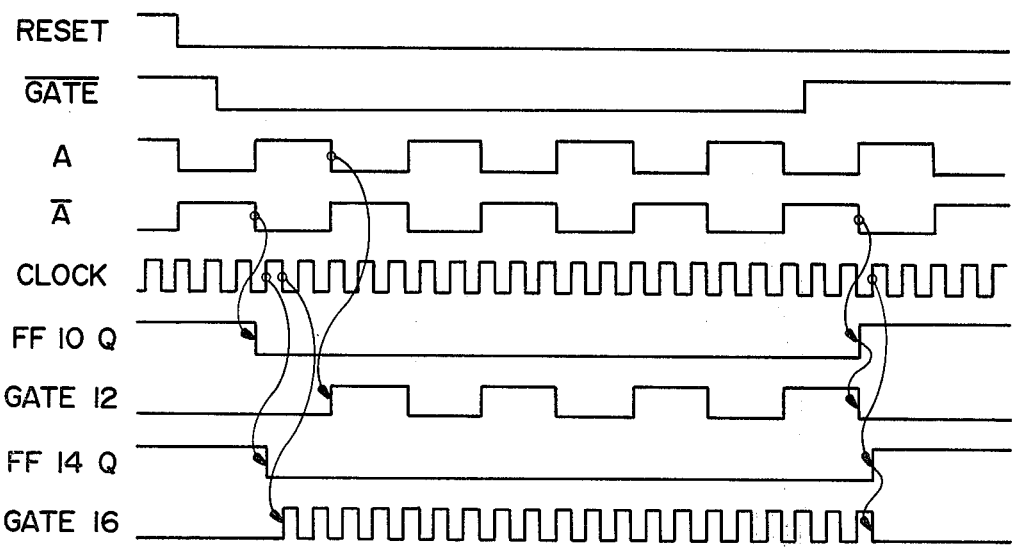
FIG. 2 is a logic table relating the control signals in the gate control circuit of FIG. 1 to universal counter functions.
FIG. 3 is a waveform diagram to facilitate explanation of the circuit of FIG. 1.

To summarize the discussion of the control signals from control logic unit 40, refer to FIG. 2, which shows a logic table of signal status of the various control signals for a number of universal counter functions. The black spot means that the control signal is low, while a blank space indicates that the control signal is high. A particular set of control signals may be applied to activate certain high-speed signal paths for a particular universal counter function, and it would then be a rather academic exercise for those skilled in the art to trace the circuit action. As an example, assume that it is desired to measure the width of a pulse applied to the A input. This measurement is commonly achieved by opening a gate on the leading edge of the pulse of interest, counting known pulses while the gate is open, and then closing the gate on the trailing edge of the pulse of interest. So, observing the logic status associated with WIDTH A in FIG. 2, control signals V and Y are high while control signals W, X, and Z are low. Thus, transistors 42, 54, 24 and 34 are turned off. One input of gate 12 is pulled low through a pull-down resistor while the other input is held high by the Q output of flip-flop 10. Transistor 52 is turned on to route input signal A to one input of negative-input AND gate 50, which is disabled for the moment by the high applied to the other input thereof from the Q output of flip-flop 10 (assuming PRESET is high). Transistor 62 is turned on, passing the CLOCK signal to the negative-input AND gate 16, which is held disabled by the high Q output of flip-flop 14. Transistor 66 is turned on, passing the low Q output of flip-flop 10 to the inputs of OR gate 56 and AND gate 70. The $\overline{GATE}$ signal is initially high, so that after RESET goes low, the Q outputs of flip-flops 10 and 14 are held high by the high applied to the D input of flip-flop 10. With all of these conditions established, the pulse width measurement may be made. First, the $\overline{GATE}$ signal is pulled low, arming flip-flop 10 by placing a low at the D input thereof. Suppose the leading edge of a pulse A goes high, and therefore $\overline{A}$ goes low. AND gate 50 is still disabled; however, AND gate 70 is enabled, and the negative-going edge of pulse A causes the output of AND gate 70 to go high, toggling flip-flop 10 and passing the low on the D input thereof to the Q output, and hence to the D input of flip-flop 14, and enabling AND gates 12 and 50 as well. The output of gate 12 goes high, toggling flip-flop 26. The $\overline{Q}$ output of flip-flop 10 goes high, disabling gate 70, and placing a high via OR gate 56 at the D input of flip-flop 10. The next positive-going CLOCK signal edge applied to flip-flop 14 clocks the low at the D input thereof to the Q output, and when the CLOCK signal goes negative, the AND gate 16 is enabled, causing its output to go high, toggling flip-flop 36 in the Channel B count chain. With AND gate 16 thus enabled by the low Q output of flip-flop 14, the CLOCK signal passes therethrough and the resulting positive edges thereof are counted by the Channel B count chain. Eventually, the trailing edge of the A input pulse arrives. This time, the positive-going transition of the $\overline{A}$ signal has no effect because AND gate 70 is disabled; however, the negative-going edge of the A pulse applied via transistor 52 causes the output of now-enabled AND gate 50 to go high, toggling flip-flop 10 and advancing the high at the D input thereof to the Q output, disabling gate 12. The next positive-going CLOCK signal edge clocks the high through to the Q output of flip-flop 14, disabling AND gate 16, thus terminating the CLOCK-pulse count in the Channel B count chain. The Channel A count chain registered only a single count during this operation. Thus, at the end of this cycle, there is one count in the A count chain, and a number of counts in the B count chain proportional to the width of the A pulse. These counts may now be read by a microprocessor, which computes the elapsed time between the leading and trailing edges of the A pulse to yield a pulse width measurement. Alternatively, the process may be repeated many times to yield a WIDTH A average measurement. To calculate the average width, the microprocessor simply divides the B count by the A count to yield the average number of CLOCK pulses per cycle.

Discussing the circuit operation again utilizing the waveforms shown in FIG. 3, assume that it is desired to measure the period of a repetitive signal applied to the Channel A input terminal 20. Referring again to FIG. 2, it is seen that all of the control signals V, W, X, Y, and Z are high. Thus, AND gate 50 is disabled for this measurement, CLOCK signals are activated via transistor 62, transistors 34 and 66 are shut off, and transistor 24 is turned on to pass input signal A to AND gate 12. Initially, the RESET signal is high, forcing the Q outputs of all the flip-flops high. The $\overline{\text{GATE}}$ signal is high, and after RESET goes low, the $\overline{\text{GATE}}$ signal holds the Q outputs of the synchronizing flip-flops 10 and 14 high, keeping AND gates 12 and 16 disabled. When the $\overline{\text{GATE}}$ signal goes low, the measurement cycle is activated.

When the $\overline{\text{GATE}}$ signal goes low, a logical low is placed at the D input of flip-flop 10. On the next negative-going edge of the $\overline{\text{A}}$ signal, the output of negative-input AND gate 70 goes high, toggling flip-flop 10 and clocking the low D input thereof through to the Q output, thereby enabling AND gate 12. However, since the A signal is high at this time, the output of AND gate 12 remains low. The next positive-going CLOCK signal transition applied to flip-flop 14 clocks the low D input thereof through to the Q output, thereby enabling AND gate 16. However, since the CLOCK signal is high at this time, the output of AND gate 16 remains low. When the CLOCK signal goes low, the output of AND gate 16 goes high, and the positive-going transition produced thereby toggles the Channel B count chain flip-flop 36, thus beginning the count of clock pulses. Similarly, when the A signal goes low, the output of enabled AND gate 12 goes high, and the positive-going transition produced thereby toggles the Channel A count chain flip-flop 26, thus beginning the count of A signal cycles. These conditions established, AND gates 12 and 16 will remain enabled until the $\overline{\text{GATE}}$ signal goes high, with the count chains receiving inverted A input signals and CLOCK signals respectively.

Eventually the $\overline{\text{GATE}}$ signal is brought high to end the measurement, and on the next negative-going edge of the A input signal, a positive-going transition is produced at the output of AND gate 70, toggling flip-flop 10, and clocking the high $\overline{\text{GATE}}$ signal from the D input of flip-flop 10 to the Q output thereof, disabling AND gate 12 and thereby terminating the count in the Channel A count chain. On the next positive-going CLOCK signal transition, the high is clocked from the D input of flip-flop 14 to the Q output thereof, disabling AND gate 16 and thereby terminating the count in the Channel B count chain. A microprocessor may then read the count chains and compute the number of clock pulses per cycle of signal A, and further, by dividing, compute the average period of one cycle of signal A. Also, the reciprocal of this result may be calculated to yield the frequency of the signal A. Note from FIG. 2 that the logic status of control signals V-Z is identical for both FREQUENCY A and PERIOD A measurements.

Figure 4:
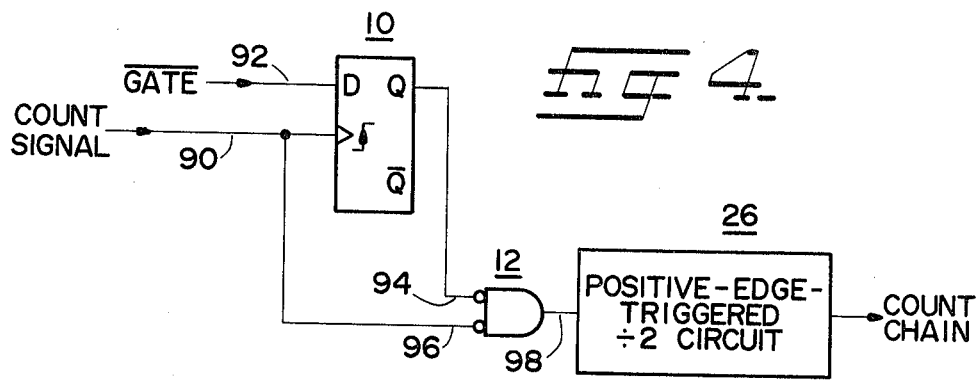
FIG. 4 is a schematic of a single synchronizing flip-flop and its associated gate.
Figure 5:
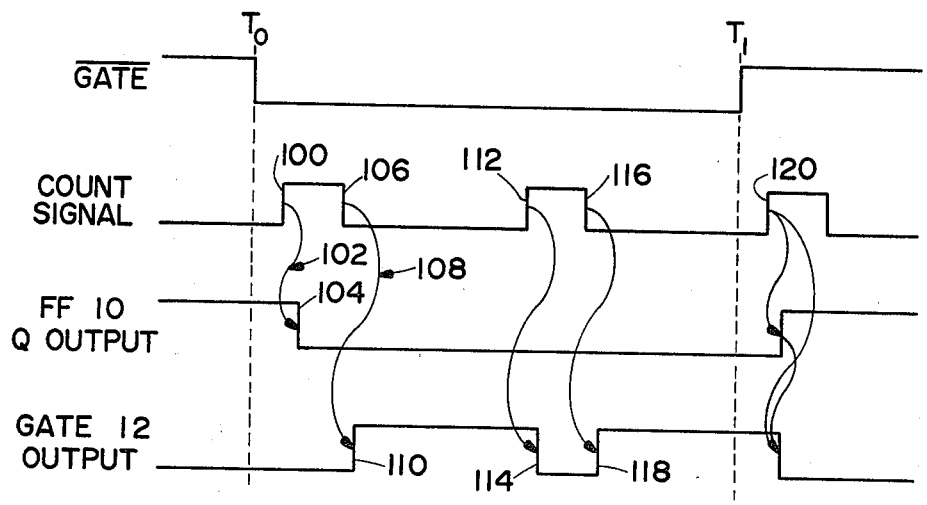
FIG. 5 is a timing diagram to illustrate the operation of the circuit of FIG. 4.

From the foregoing discussion, it can be seen that the energizing edges of signals which activate the synchronizing flip-flops 10 and 14 and enable the gates 12 and 16 are of opposite polarity to the signal edges that activate the first count chain flip-flops 26 and 36. The importance of this will become clear by a closer look at one of the synchronizer flip-flops and its associated gate as shown in FIG. 4, and the timing diagram of FIG. 5. For simplicity, the flip-flop 10, negative-input AND gate 12 and a positive-edge-triggered countdown device 26 are shown without additional details, and a signal to be counted is applied directly over a line 90 to the clock input of the flip-flop 10. The $\overline{\text{GATE}}$ signal is applied directly over a line 92 to the D input. The Q output of the flip-flop and the count signal are coupled via lines 94 and 96, respectively, to the inputs of AND gate 12. The output of AND gate 12 is coupled via line 98 to the countdown device 26. Initializing the system, $\overline{\text{GATE}}$ on line 92 is high, as is the Q output on line 94. With AND gate 12 thus disabled, its output on line 98 is low. At some time $T_O$, the $\overline{\text{GATE}}$ control signal on line 92 is brought low, and the next positive-going transition 100 of the count signal on line 90 toggles flip-flop 10. After a slight propagation delay 102, the low at the D input of flip-flop 10 arrives at the Q output, resulting in the negative-going transition 104 on line 94. Gate 12 is now armed. On the next negative-going transition 106 of the count signal, gate 12 is enabled and after a short propagation delay time 108, the output of gate 12 goes high, resulting in positive-going transition 110. The next positive-going transition 112 of the count signal on line 90 results in a negative-going transition 114 at the output of gate 12, as long as the $\overline{\text{GATE}}$ signal is still low. And then the next negative-going transition 116 results in a positive-going transition 18 at the output of gate 12. This activity may continue; however, for purpose of illustration, suppose that at some time $T_1$, the $\overline{\text{GATE}}$ signal on line 92 is pulled high. Thereafter, the next positive-going transition 120 of the count signal pulls line 96 high and clocks the high GATE signal through flip-flop 10, pulling line 94 high, resulting in immediate disabling of AND gate 12 and setting line 98 low. Now it can be seen that two positive-going transitions 100 and 112 of the count signal occur between the times $T_O$ and $T_1$; however, it is the subsequent negative-going transitions 106 and 116 that result in the positive-going transitions 110 and 118 that are counted by the count chain. It can also be seen that the negative edge 106 could fall anywhere between the positive edges 100 and 112 (even prior to edge 104) and still result in a positive edge 110 to be counted. On the other hand, no glitches can appear on line 98 to produce an erroneous count. In addition, the propagation delay 102 can be long compared with the width of the count signal. Indeed, it may be any length up to the period of the count signal minus the minimum width that must appear at line 98 for flip-flop 26 to reliably count. Thus the need for delay matching of signal paths by interposing additional gates is obviated.

It will therefore be appreciated that the afore-mentioned and other desirable objects have been achieved; however, it should be noted that the particular embodiment of the invention and modes of operation thereof which are shown and described herein are intended as merely illustrative and not as restrictive of the invention.

What I claim as my invention is:

1. A gating circuit for an electronic counter, comprising:
    a first bistable control circuit responsive to an arming signal and a first triggering signal for producing a first enable signal, said first triggering signal being selectable from a first input signal and a second input signal;

a first gate circuit responsive to said first enable signal for producing a first count signal;

means for applying said first input signal to said first gate circuit;

a second bistable control circuit responsive to said first enable signal and a second triggering signal for producing a second enable signal, said second triggering signal being selectable from said second input signal and a clock signal; and a second gate circuit responsive to said second enable signal and said second triggering signal for producing a second count signal.

2. A gating circuit in accordance with claim 1 further comprising logic control means for establishing one of a plurality of operating modes by selectively coupling said first and second input signals, said arming signal, and said clock signal to said bistable control circuits and said gate circuits in a predetermined manner.

3. A gating circuit in accordance with claim 1 wherein said first and second bistable control circuits comprise triggered flip flops.

4. A gating circuit in accordance with claim 1 wherein each said count signal is produced in synchronism with a respective triggering signal and on the opposite-slope edge to that used to trigger the respective bistable control circuit.

* * * * *